United States Patent
Wimmer et al.

(10) Patent No.: US 10,057,953 B2
(45) Date of Patent: Aug. 21, 2018

(54) LED MODULE WITH INTEGRATED CURRENT CONTROL

(71) Applicants: TRIDONIC JENNERSDORF GMBH, Jennersdorf (AT); TRIDONIC GMBH & CO KG, Dornbirn (AT)

(72) Inventors: Florian Wimmer, Jennersdorf (AT); Steffen Riemer, Krottendorf-Gaisfeld (AT); Istvan Bakk, Torokbalint (HU); Eduardo Pereira, Siebnen (CH); John Schonberger, Reichenburg (CH)

(73) Assignees: TRIDONIC JENNERSDORF GMBH, Jennersdorf (AT); TRIDONIC GMBH & CO KG, Dornbirn (AT)

( * ) Notice: Subject to any disclaimer, the term of this patent is extended or adjusted under 35 U.S.C. 154(b) by 0 days.

(21) Appl. No.: 15/128,814

(22) PCT Filed: Mar. 18, 2015

(86) PCT No.: PCT/EP2015/055673
§ 371 (c)(1),
(2) Date: Sep. 23, 2016

(87) PCT Pub. No.: WO2015/144524
PCT Pub. Date: Oct. 1, 2015

(65) Prior Publication Data
US 2017/0118810 A1    Apr. 27, 2017

(30) Foreign Application Priority Data

Mar. 27, 2014  (DE) .................. 10 2014 205 748
Oct. 13, 2014  (DE) .................. 10 2014 220 656

(51) Int. Cl.
*H01L 33/60*    (2010.01)
*H05B 33/08*    (2006.01)
(Continued)

(52) U.S. Cl.
CPC .......... *H05B 33/0845* (2013.01); *F21V 7/00* (2013.01); *F21V 9/08* (2013.01); *H01L 33/502* (2013.01);
(Continued)

(58) Field of Classification Search
CPC ............ H05B 33/0854; H05B 33/0809; H01L 33/502; H01L 33/56; H01L 33/60; H01L 33/62; F21V 9/08
(Continued)

(56) References Cited

U.S. PATENT DOCUMENTS 8,643,290 B2 *  2/2014  Liu .................... G09G 3/3406
                                                     315/192
2005/0239227 A1  10/2005  Aanegola et al.
(Continued)

FOREIGN PATENT DOCUMENTS

DE    102009037919 A1    2/2011

*Primary Examiner* — Thai Pham
*Assistant Examiner* — Syed M Kaiser
(74) *Attorney, Agent, or Firm* — Volpe and Koenig, P.C.

(57) ABSTRACT

The present application relates to a LED module (10) for being connected to a DC power supply (11), the LED module comprising a multilayer board (2) comprising a metal surface (2a) and a dielectric layer (2b) arranged thereon, at least one LED chip (1) arranged on the metal surface (2a) of the multilayer board, an encapsulation layer (3) arranged above the at least one LED chip (1), and current regulator means (4) arranged on the multilayer board, wherein the current regulator means (4) are designed to convert a DC input provided to the module (10) to a predefined DC output for being provided to the at least one LED chip (1).

15 Claims, 3 Drawing Sheets

(51) Int. Cl.
*F21V 9/08* (2018.01)
*F21V 7/00* (2006.01)
*H01L 33/62* (2010.01)
*H01L 33/56* (2010.01)
*H01L 33/50* (2010.01)
*F21Y 115/10* (2016.01)

(52) U.S. Cl.
CPC .............. *H01L 33/56* (2013.01); *H01L 33/60* (2013.01); *H01L 33/62* (2013.01); *H05B 33/0809* (2013.01); *F21Y 2115/10* (2016.08)

(58) Field of Classification Search
USPC ........................................ 315/201, 394, 307
See application file for complete search history.

(56) References Cited

U.S. PATENT DOCUMENTS

| | | |
|---|---|---|
| 2006/0197444 A1 | 9/2006 | Takeda et al. |
| 2007/0159421 A1 | 7/2007 | Peker et al. |
| 2007/0228999 A1* | 10/2007 | Kit ..................... H05B 33/0803 315/291 |
| 2011/0019188 A1* | 1/2011 | Ray ........................ B64D 15/20 356/342 |
| 2012/0139442 A1* | 6/2012 | Soleno ............... H05B 33/0815 315/294 |
| 2012/0256561 A1* | 10/2012 | Kwon ................ H05B 33/0815 315/307 |
| 2012/0262065 A1 | 10/2012 | Rowlette et al. |
| 2012/0281444 A1* | 11/2012 | Dent ...................... H02M 1/32 363/56.01 |
| 2012/0286663 A1* | 11/2012 | Puvanakijjakorn ........................ H05B 33/0845 315/85 |
| 2013/0082675 A1 | 4/2013 | Capodivacca et al. |
| 2013/0200707 A1* | 8/2013 | Hartmann ................ H02J 9/02 307/39 |
| 2013/0334974 A1 | 12/2013 | Tamura et al. |
| 2014/0070710 A1* | 3/2014 | Harris ................ H05B 33/0809 315/185 R |
| 2014/0084800 A1* | 3/2014 | Lee .................... H05B 33/0815 315/200 R |

* cited by examiner

LED MODULE WITH INTEGRATED CURRENT CONTROL

FIELD OF THE INVENTION

The present invention relates to a LED module, in particular to a LED module with integrated current regulator means. The LED module is in particular designed for being connected to an LED spotlight.

BACKGROUND

In view of a general desire for miniaturization and integration of a LED light source, LED light sources such as e.g. LED spotlight modules are generally optimized for providing the highest possible light flux density at the smallest dimensions of the light source. Thereby, it is known to integrate a current regulator such as converter circuit for converting alternating current (AC) in direct current (DC) to the LED module in order to provide such integrated LED light source. Accordingly, a plurality of individual LED modules may be connected to a provided 230V power supply, wherein the converter circuit on the respective LED module controls the current provision to the respective LED chip of the LED module.

This approach puts certain constraints on the design of the LED module in particular with regards to the necessary space of the current regulator. The required space and the dimensioning of an LED module provided in an LED light source is however of high importance for providing an integral and compact design of the LED luminaire comprising such module. Thereby, increasingly stronger requirements are put to the dimensions of the LED modules in order to enable a further compaction of the light source respectively the luminaires.

Based on the known prior art, the present invention addresses the problem of providing an enhanced and integral LED module with integrated current control. The invention also aims at other objects and particularly the solution of other problems as will appear in the rest of the present description.

SUMMARY

The above-indicated object is solved by means of the independent claims of the invention. The dependent claims further develop the central idea of the invention.

In a first aspect, the invention relates to an LED module for being connected to a DC power supply, the LED module comprising a multilayer board comprising a metal surface and a dielectric layer arranged thereon, at least one LED chip arranged on the metal surface of the multilayer board, an encapsulation layer arranged above the at least one LED chip, and current regulator means arranged on the multilayer board. The current regulator means are designed to convert a DC input provided to the LED module to a predefined DC output for being provided to the at least one LED chip.

According to the invention, the LED module is designed for being operated with a constant voltage supply, whereby the actual current generator for the at least one LED chip is arranged on the LED module itself. Hence, better tuning and matching of the current regulator means to the individual LED module respectively the at least one LED chip of the module is enabled. Accordingly, a matching of the current regulator or current converter to the specific LED chip of the LED module may be carried out at a manufacturing step of the LED module. Hence, no later efforts to match the converter electronic to a LED module and thereby adapt the light output for each individual LED module are necessary by the costumer. Moreover, an integrated LED module is provided that allows for reducing of manufacturing costs and provides performance benefits. Thereby, as preferably no AC/DC converter is directly arranged at the LED module, the required space and dimensions of the LED module are minimized.

The current regulator may be a DC/DC converter or an analog current/voltage regulator. In a preferred embodiment, the current regulator means is a DC converter for receiving a DC input and providing a DC output to the at least one LED chip. The current regulator means are preferably designed for operating at input current and/or voltages in the SELV region which is typically below 60 Volts. The regulator means may be designed for receiving voltages of a standard value of e.g. 12, 24, 42, 48 or 50 Volts. The regulator means are preferably designed to receive a voltage between 40 and 60 Volts, more preferably between 50 and 60 Volts.

The current regulator means may have a particular architecture to provide a desired current to the at least one LED chip of the module. A preferred DC/DC converter may be designed for enabling a feedback regulation of the current supplied to the at least one LED chip of the module. The current regulator means are preferably designed to work at high frequency of preferably between 50 kHz to 5 MHz.

The current regulator means may comprise a switch mode converter, using at least actively clocked switch which is clocked at high frequency of preferably between 50 kHz to 5 MHz. The current regulator means may comprise an inductor or capacitor for energy storage. The current regulator means may comprise a buck topology, a boost topology, a buck-boost or split-pi topology, a charge pump, or an isolated switched converter topology like a flyback converter or a resonant halfbridge converter. The current regulator comprising a switch mode converter may operate in a continuous, discontinuous mode and/or a borderline mode depending on the load state and output power.

In case that the current regulator is formed by an analog current/voltage regulator, such analog current/voltage regulator may be formed by a linear regulator e.g. a constant current sink. Such current regulator would be a non-switching mode embodiment, using a linear regulator for current control.

The metal surface of the multilayer board may be a metal substrate, a metal layer or a metal foil. The metal substrate, layer or foil may be provided on a dedicated carrying layer or substrate. The metal substrate or layer may as well form a bottom portion of the LED module.

In a preferred embodiment, the multilayer board preferably comprises a metal substrate and a dielectric layer arranged thereon. The metal substrate is preferably made from aluminum which may be plated or coated aluminum. The aluminum substrate is preferably a highly conductive substrate. The metal substrate preferably has a reflective surface. The at least one LED chip is preferably mounted on the reflective surface of the metal substrate.

Further, the multilayer board preferably comprises a dielectric layer such as a printed circuit board preferably comprising FR4, F2, CEM1 or CEM3.

In a preferred embodiment, the multilayer board is an insulated metal substrate (IMS substrate) comprising an aluminum substrate and a printed circuit comprising FR4, F2, CEM1 and/or CEM laminated on the substrate. The thickness of the multilayer board is preferably between 50 to 500 microns.

The dielectric layer of the multilayer board preferably comprises a recess in which the at least one LED chip is arranged such that the LED chip can be directly placed onto an upper surface of the metal substrate.

The module preferably comprises a reflector selectively connectable to the module and arranged to surround the at least one LED chip. The reflector is preferably selectively connectable to the dielectric layer and/or on the metal surface of the multilayer board.

The current regulator means are preferably arranged exclusively on the dielectric layer such as for example a printed circuit board of the multilayer support board. Alternatively, the current regulator means may at least in part be arranged on the metal surface of the multilayer board. Thereby, at least one component or all components of the regulator means may be arranged on the metal surface. Accordingly, heat dissipation from the components may be tailored to the specific needs of the LED module. The current regulator means may be arranged to be enclosed by the encapsulation layer.

The encapsulation layer provided on the module is preferably made from silicone or epoxy material. The encapsulation layer preferably comprises colour color conversion particles for converting at least part of the light emitted by the at least one LED chip to light of another wavelength.

The LED module according to the invention is preferably designed to emit white light. Thereby, the at least one LED chip is preferably a blue LED die. The encapsulation layer may comprise color conversion particles which convert at least part of the blue LED primary light in light of another wavelength such as e.g. yellow or greenish-yellow light.

In a preferred embodiment the encapsulation layer is provided within an outer dam arranged on a surface of the dielectric layer and/or a surface of the metal surface. The outer dam is preferably made from silicone or epoxy material. The outer dam is preferably applied to the surface of the multilayer board via a dispensing process in which the dam is applied in liquid or viscous form and is then cured. The outer dam preferably protrudes perpendicular from the surface of the multilayer board. The outer dam may be arranged at the boundary of a recess of the dielectric layer of the multilayer board in which recess the at least one LED chip is arranged.

The LED module preferably further comprises a housing designed for receiving the multilayer board of the module. The housing may be specifically shaped to be connected to a LED luminaire or a LED spotlight module.

In a further aspect, the invention relates to a LED spotlight comprising an LED module as described above. The LED module is preferably designed for being selectively connectable to the LED spotlight. Thereby, a housing of the LED module may be specifically designed in its dimensions and/or positioning of dedicated connection means to be selectively connected to a particular LED spotlight.

The LED module may be designed according to the Zhaga standard in order to be selectively connected to a large variety of different LED spotlights or LED luminaires according to this standard.

In a further aspect, the present invention relates to a system comprising at least two LED modules as described here-above and a central AC/DC power converter designed to provide a DC output voltage and a direct current to the respective LED modules.

The at least two LED modules are preferably arranged in series or parallel with regards to the AC/DC power converter and/or are connected to a DC bus system. The LED modules are preferably connected via a DC bus system carrying voltage and current in the SELV region. The at least two LED modules may further be designed to communicate through the DC bus system to adjust the intensity, color or radiation pattern of the emitted light.

The AC/DC power converter is preferably designed for converting an AC input current of a main power supply to a DC output voltage of below 60 Volts, preferably between 40 and 60 Volts. The AC/DC power converter preferably comprises an active power factor correction circuit which may comprise a rectifier followed by a clocked converter which provides a regulated and stabilized DC output voltage.

A dimming operation of the respective LED module may be carried out centrally for all LED modules e.g. by means of a PWM modulation of the DC power supply respectively the DC bus system to which the individual LED modules are connected. The current regulator means of the individual LED modules may as well be designed to provide a dimming operation of the LED chips arranged on the LED module e.g. by means of PWM modulation or amplitude modulation performed by the current regulator of the LED module.

BRIEF DESCRIPTION OF THE FIGURES

Further features, advantages and objects of the present invention will become apparent for the skilled person when reading the following detailed description of embodiments of the present invention, when taken in conjunction with the figures of the enclosed drawings.

DETAILED DESCRIPTION OF THE PREFERRED EMBODIMENTS

Figure 1:
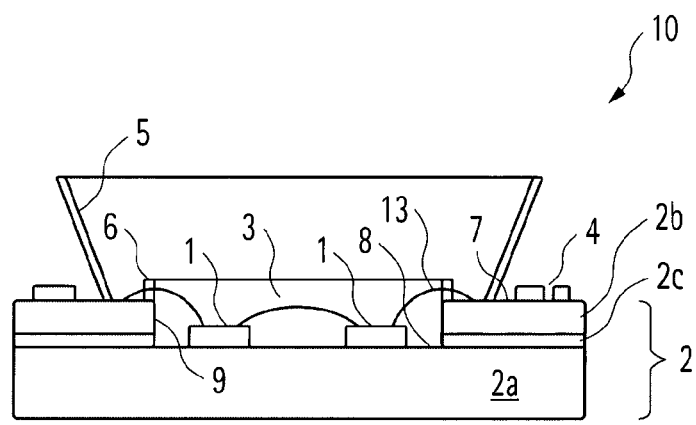
FIG. 1 is a perspective sectional side view of a preferred embodiment of the LED module according to the invention.

FIG. 1 relates to a preferred embodiment of an LED module 10 according to the present invention in sectional side view. The LED module 10 comprises a multilayer board 2 which comprises a metal surface 2a, preferably a metal substrate such as an aluminum substrate, having a dielectric layer 2b such as e.g. a printed circuit board (PCB) 2b arranged thereon.

The printed circuit board is preferably laminated to the relatively thicker metal substrate by means of an insulating layer 2c such as e.g. an adhesive. The PCB 2b preferably comprises wiring on an upper surface 7 thereof. The PCB 2b may as well comprise wiring on the upper surface 7 as well as on a lower surface facing the insulating layer 2c.

The PCB 2b comprises an opening or recess 9 which is preferably arranged within a central part of the PCB 2b. An at least one LED chip 1 of the module 10 is arranged directly on an upper surface 8 of the metal substrate 2a.

Thereby, LED chip 1 is arranged within the recess 9 provided in the PCB 2b. As shown in FIG. 1, the module may comprise two or more LED chips 1. The LED chip(s) 1 is/are preferably connected via bonding wires 13 to the wiring of the PCB 2b.

The recess 9 of the PCB 2b in which the at least one LED chip 1 is arranged is preferably circular when seen from above. The at least one LED chip 1 is mounted directly on the surface of the metal substrate 8, which is preferably highly reflective. Accordingly, a highly efficient light output of the LED chip 1 obtained.

A dam 6 is preferably arranged to protrude from a surface of the multilayer board 2. Thereby, the dam 6 is preferably made by dispensing a viscous epoxy or silicone material on the surface of the board 2 which is then cured. The dam 6 is preferably arranged at the boundary between the PCB 2b and the metal substrate 2a. Thereby, the dam 6 is preferably arranged on the PCB 2b as shown in FIG. 1. The dam 6 may however as well be at least partially formed on the upper surface 8 of the metal substrate 2a.

In the recess 9 and/or within the area enclosed by the dam 6, an encapsulation layer 3 is preferably arranged. Thereby, the encapsulation layer 3 is preferably filled into the recess 9 respectively the outer dam 6. An upper surface of the encapsulation layer 3 is preferably arranged to be flush with the uppermost portion of the dam 6. The encapsulation layer 3 is made from silicone or epoxy material and preferably comprises color conversion particles dispersed therein. The color conversion particles are preferably designed for converting at least part of the light emitted by the at least one LED 1 into a light of a different wavelength. Thereby, the LED chip and the color conversion material are preferably chosen obtain a white light emission from the LED module 10.

At the circumference of the dam 6, a reflector 5 is arranged. The reflector 5 comprises a preferably highly reflective inner surface for reflecting the light emitted by the LED chip 1. The reflector 5 is preferably selectively connectable to the upper surface 7 of the PCB 2b.

At the circumference of the reflector 5 respectively radially outwards of the reflector 5, current regulator means 4 are arranged on the multilayer board. Thereby, the regulator means 4 are preferably designed to convert a DC input provided to the LED module 10 to a predefined DC output current for being provided to the at least one LED chip 1.

The current regulator means 4 are preferably arranged exclusively on the surface of the PCB 2b and connected to the wiring of the PCB 2b. However, at least parts of the regulator means 4 may as well be arranged on the surface 8 of the metal substrate 2a. Thereby, the PCB 2b may comprise a dedicated recess or opening in order to allow for the regulator means 4 to be directly placed on the surface of the metal substrate 2a. Further, the regulator means 4 may be at least partially arranged within the recess 9 provided in the PCB. Thereby, at least parts of the regulator means 4 may be provided within the encapsulation layer 3.

Figure 2:
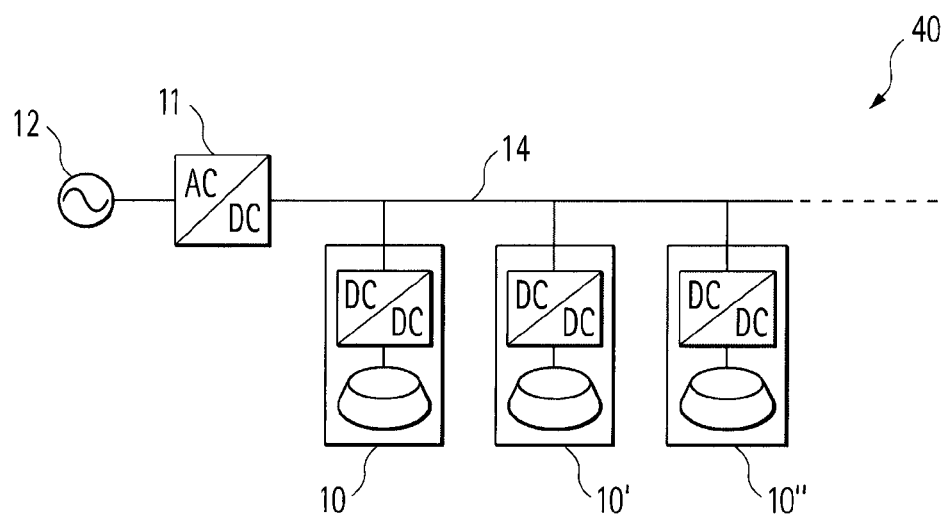
FIG. 2 is a preferred embodiment of a system: comprising at least two LED module connected to a central power supply.

FIG. 2 relates to preferred embodiment of a system 40 according to the invention. The system 40 comprises a plurality of LED modules 10, 10', 10" which are connected to a central power supply 12 via a central AC/DC converter respectively an AC/DC PFC rectifier 11. The AC/DC PFC rectifier 11 comprises an active power factor correction circuit e.g. a rectifier followed by a clocked converter which provides a regulated and stabilized DC output voltage. The central AC/DC converter respectively an AC/DC PFC rectifier 11 may also comprise a DC/DC converter stage with potential isolation in order to supply a voltage according to the SELV requirements. The central AC/DC converter is preferably designed to convert the AC current of a main power supply 12 to a DC voltage or DC current in the SELV region, preferably below 60V. This DC voltage or DC current is preferably provided to a DC bus system 14 to which the respective LED modules 10, 10', 10" are connected. Accordingly, the redundant part of the AC/DC converter is centrally provided within the system for all LED modules 10, 10', 10" which provides for cost benefits. Moreover, matching of the DC/DC converter of each module 10, 10', 10" to the LED chip(s) is facilitated. Thereby, the manufacturing and components costs may be minimized. Moreover, due to the SELV voltage used, no double insulation and grounded parts are required at the DC bus 14 respectively downstream of the AC/DC converter.

The current regulator means 4 may have a particular architecture to provide a desired current to the at least one LED chip of the LED modules 10, 10', 10". A preferred DC/DC converter may be designed for enabling a feedback regulation of the current supplied to the at least one LED chip of the LED modules 10, 10', 10".

The current regulator means 4 may comprise a switch mode converter, using at least actively clocked switch which is clocked at high frequency of preferably between 50 kHz to 5 MHz. The current regulator means 4 may comprise an inductor or capacitor for energy storage. The current regulator means 4 may comprise a buck topology, a boost topology, a buck-boost or an isolated switched converter topology like a flyback converter or a resonant halfbridge converter. The current regulator comprising a switch mode converter may operate in a continuous, discontinuous mode and/or a borderline mode, e.g. depending on the load state, dimming level or output power.

In case that the current regulator 4 is formed by an analog current/voltage regulator such analog current/voltage regulator may be formed by a linear regulator e.g. a constant current sink. Such current regulator would be a non switching mode embodiment, using a linear regulator for current control.

A plurality of LED modules 10, 10', 10" are preferably is in parallel with regards to the DC bus system 14 which is powered by the central AC/DC converter respectively an AC/DC PFC rectifier 11. The AC/DC PFC rectifier 11 and the LED modules 10, 10', 10" may be designed to communicate through the DC bus system 14 to adjust the intensity, color or radiation pattern of the emitted light. Such communication on the DC bus system 14 may be performed by power line communication.

Therefore the AC/DC PFC rectifier 11 and the LED modules 10, 10', 10" may comprise a sending unit and/or a reception unit to transmit and receive signals modulated onto the DC bus system 14.

The current regulator means 4 of the individual LED modules may be designed to provide a dimming operation of the LED chips arranged on the LED modules 10, 10', 10" e.g. by means of PWM modulation or amplitude modulation performed by the current regulator means 4 of the LED module. By such dimming operation of individual LED chips the intensity, color or radiation pattern of the emitted light can be changed.

In an alternative variant a dimming operation of the respective LED module may be carried out centrally for all LED modules e.g. by means of a PWM modulation of the DC bus system 14 to which the individual LED modules 10, 10', 10" are connected.

Figure 3:
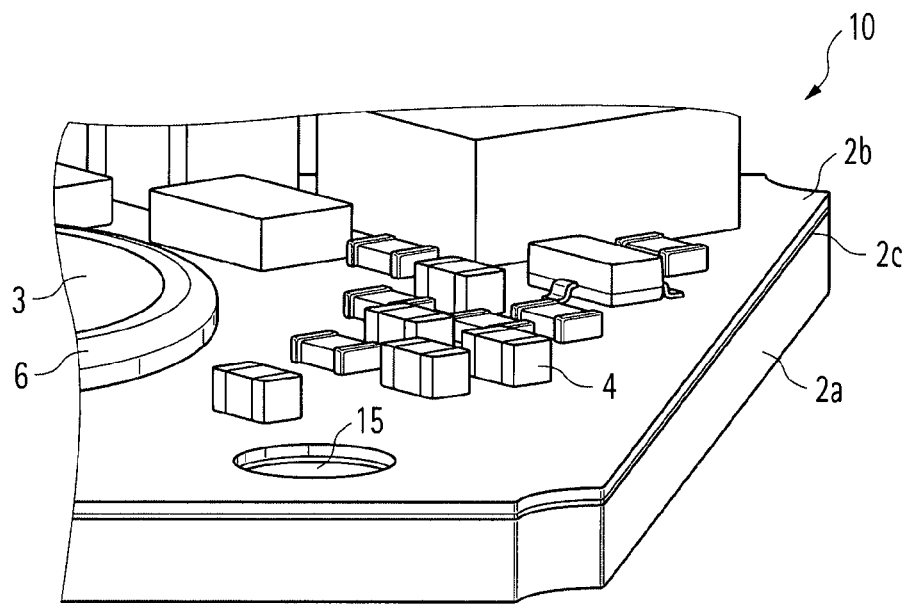
FIG. 3 is a perspective side view of a LED module as shown in FIG. 1.

FIG. 3 shows a perspective side view of the LED module 10 according to FIG. 1 without reflector 5 connected to the module. As shown in the figure, the multilayer board 2 comprises a relatively thick substrate of metal such as aluminum 2*a*. Thereon, the PCB 2*b* is laminated by means of an adhesive layer 2*c*. Connection bores 15 are provided in the multilayer board 2 for enabling a connection with a housing 20 of the LED module 10 (see FIG. 4}.

Figure 4:
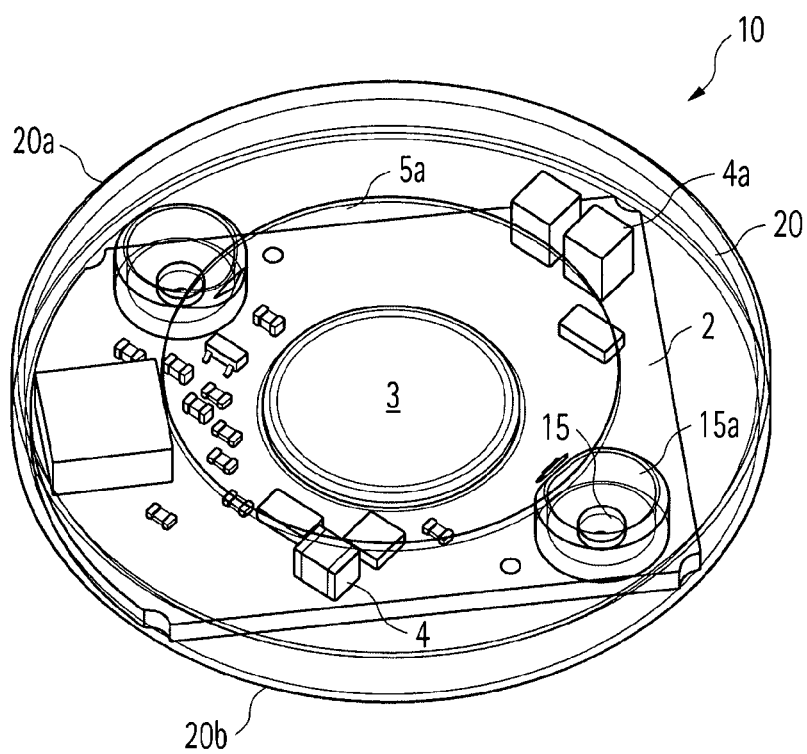
FIG. 4 is a perspective side view of a LED module as shown in FIGS. 1 and 3, wherein the multilayer board is provided in a housing of the LED module.

FIG. 4 shows the LED module 10 being connected to a housing 20 of the module. The housing 20 may comprise an essentially circular contour when seen from above. The housing may comprise an upper part 20*a* and a conformal lower part 20*b* for enclosing the multilayer board 2 and the components mounted thereon. Thereby, the connection bores 15 of the multilayer board 2 are aligned with openings 15*a* in the housing 20 in order to enable a connection. The housing may comprise dedicated fitting means 5*a* for enabling a connection of the reflector 5 or an additional optic or lens to the housing 20 and/or the multilayer board 2 of the LED module 10.

Figure 5:
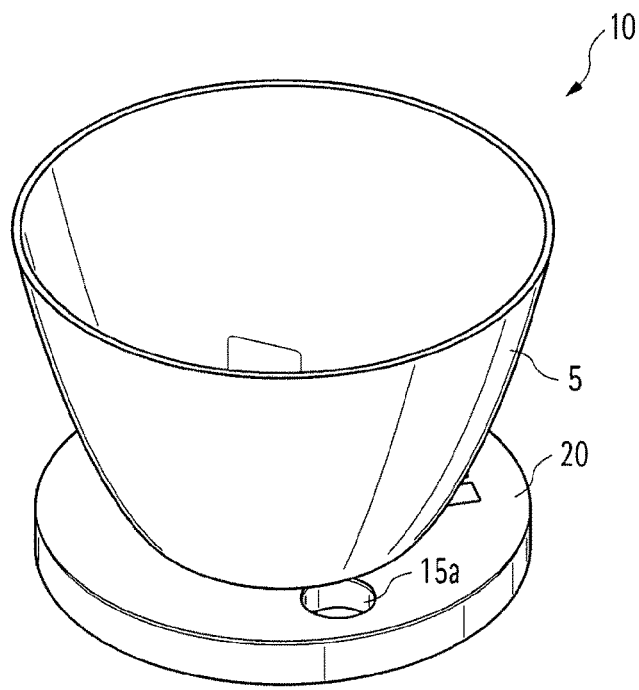
FIG. 5 shows a preferred embodiment of a LED module comprising a reflector and a housing to which the reflector may be connected.

FIG. 5 relates to the LED module 10 in the connected state of the housing 20 and the reflector 5. Thereby, the reflector 5 is preferably adapted to be selectively connected to the multilayer board 2 and/or the housing 20 of the LED module 10.

Figure 6:
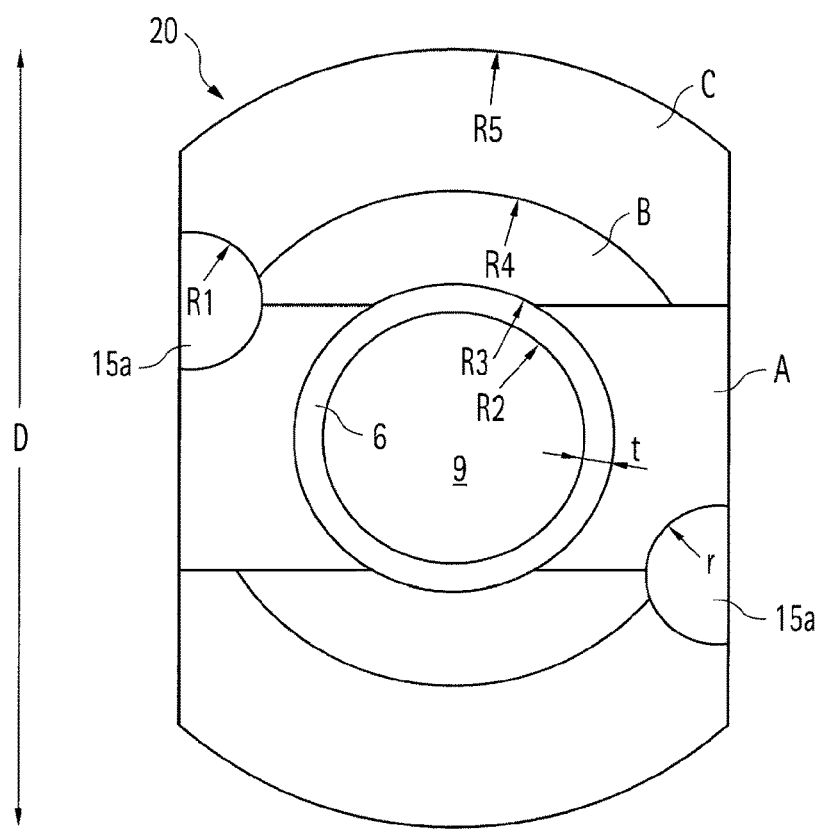
FIG. 6 is a top view of a preferred embodiment of the LED module.

FIG. 6 relates to a top view of the LED module according to the present invention, thereby identifying preferred dimensions of the module. In particular, the housing 20 of the LED module 10 comprises a circular shape when seen from above having a diameter D. The diameter D is preferably between 40 and 60 mm. In a preferred embodiment, the diameter D of the housing is 50 mm.

The housing 20 of the module 10 further comprises radially arranged sectors A,B,C which differ in their height respectively thickness of the housing when seen in side view thereof. In particular, a central section A is provided which defines a rectangular section in which the inner recess 9 comprising the at least one LED chip 1 is arranged. Thereby, no electric components are preferably arranged within this section of the housing 20 and the multilayer board 2 arranged therein. Accordingly, the housing in this section can be made very thin and in close proximity to the multilayer board 2 housed therein when seen in sectional side view. In a section B radially outside of the inner section A, only electric components having a height of below 1.5 mm are preferably arranged at the multilayer board 2. At a section C, arranged radially outside of the section B, electric components with a maximal height of 3.5 to 4 mm are arranged on the multilayer board 2 enclosed by the housing 20 in this section.

The connection bores 15*a* preferably comprise a radius R1 of between 3 and 5 mm, most preferably 4.5 mm. The inner Radius R2 of the recess 9 respectively the dam 6 is preferably between 7 and 10 mm, more preferably between 8 and 9 mm. An outer radius R3 of the dam 6 is preferably between 10 and 12, more preferably between 10 and 11 mm. The thickness t of the dam 6 when seen from above is preferably between 0.5 and 3 mm, more preferably between 1 and 2 mm.

The radius R4 of section B is preferably between 15 and 19 mm, more preferably between 16 and 18 mm.

The radius R5 of the section C is preferably between 22 and 27 mm, more preferably between 24 and 25 mm.

The above-indicated measures of the LED module 10 and housing 20 thereof are non-limiting examples for providing a compact arrangement of the LED module.

What is claimed is:

1. A LED module which is supplied with DC power, the LED module comprising
   a multilayer board comprising a metal surface and a dielectric layer arranged thereon,
   at least one LED chip arranged on the metal surface of the multilayer board,
   an encapsulation layer arranged above the at least one LED chip, and
   a current regulator arranged on the multilayer board, wherein the current regulator converts the DC power supplied to the LED module to a predefined DC output provided to the at least one LED chip wherein the metal surface is a metal substrate, a metal layer or a metal foil and is a plated or coated aluminum substrate having a reflective surface and the dielectric layer is a printed circuit board and wherein the current regulator is arranged exclusively on the dielectric layer of the multilayer board.

2. The LED module according to claim 1,
   wherein the current regulator is a DC/DC converter designed for receiving a DC input of below 60 Volts.

3. The LED module according to claim 1,
   wherein the current regulator is a DC/DC converter or an analog current/voltage regulator.

4. The LED module according to claim 3,
   wherein the DC/DC converter comprises a buck topology, a boost topology, a buck-boost or a split-pi topology.

5. The LED module according to claim 1,
   wherein the module comprises a reflector selectively connectable to the module and arranged to surround the at least one LED chip.

6. The LED module according to claim 5,
   wherein the reflector is positioned on at least one of: the dielectric layer or on the metal surface of the multilayer board.

7. The LED module according to claim 1,
   wherein the current regulator is arranged exclusively on the dielectric layer of the multilayer board.

8. The LED module according to claim 1,
   wherein the encapsulation layer comprises color conversion particles for converting at least part of the primary light emitted by the at least one LED chip to light of another wavelength.

9. The LED module according to claim 1,
   wherein the encapsulation layer is provided within an outer dam arranged on at least one of: a surface of the dielectric layer or a surface of the metal surface.

10. The LED module according to claim 1,
    wherein the LED module is designed for emitting white light.

11. A LED spotlight device comprising the LED module according to claim 1.

12. A system comprising at least two LED modules according to claim 1,
    wherein the system comprises a central AC/DC power converter designed to provide direct current or direct voltage to the respective LED modules.

13. The system according to claim 12,
    wherein the at least two LED modules are arranged in series or parallel with regards to the AC/DC power converter or are connected to a DC bus system.

14. The system according to claim 13,
    wherein the at least two LED modules or the central AC/DC power converter and at least one LED module are designed to communicate through the DC bus system to adjust the intensity, color or radiation pattern of the emitted light.

15. The system according to claim 12,
wherein the AC/DC power converter is designed for converting an AC input current of a power supply to a DC output voltage of below 60 Volts.

* * * * *